United States Patent
Wang et al.

(10) Patent No.: US 10,490,953 B2
(45) Date of Patent: Nov. 26, 2019

(54) BRIDGING PIECE, SHIELDING STRUCTURE AND DISPLAY DEVICE

(71) Applicant: BOE TECHNOLOGY GROUP CO., LTD., Beijing (CN)

(72) Inventors: Zifeng Wang, Beijing (CN); Lei Cao, Beijing (CN); Yan Ren, Beijing (CN); Changlin Leng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/927,045

(22) Filed: Mar. 20, 2018

(65) Prior Publication Data
US 2019/0165520 A1    May 30, 2019

(30) Foreign Application Priority Data

Nov. 24, 2017 (CN) .......................... 2017 1 1192359

(51) Int. Cl.
| *H01R 12/58*   | (2011.01) |
| *H01R 13/6595* | (2011.01) |
| *H05K 1/00*    | (2006.01) |
| *H01R 4/64*    | (2006.01) |

(52) U.S. Cl.
CPC ......... *H01R 13/6595* (2013.01); *H01R 12/58* (2013.01); *H05K 1/00* (2013.01); *H01R 4/64* (2013.01)

(58) Field of Classification Search
None
See application file for complete search history.

(56) References Cited

U.S. PATENT DOCUMENTS 6,241,647 B1 * 6/2001 Peng ....................... H01R 4/64
439/92
6,501,030 B1 * 12/2002 Parizi .................. H01R 12/585
174/250

\* cited by examiner

*Primary Examiner* — Tho D Ta
(74) *Attorney, Agent, or Firm* — Kinney & Lange, P.A.

(57) ABSTRACT

The embodiments of the present disclosure relate to a bridging piece, a shielding cover and a display device. The bridging piece includes a connector and an insulative insert. The connector includes a first surface and a second surface which are opposite to each other. A conductive area is configured to electrically connect the first surface with the second surface, and the insulative insert is on the second surface of the connector.

14 Claims, 3 Drawing Sheets

BRIDGING PIECE, SHIELDING STRUCTURE AND DISPLAY DEVICE

CROSS-REFERENCE TO RELATED APPLICATION

This application claims the benefit of Chinese Patent Application No. 201711192359.3 filed on Nov. 24, 2017 in the State Intellectual Property Office of China, the whole disclosure of which is incorporated herein by reference.

FIELD OF THE INVENTION

The present disclosure relates to the field of display technology, and in particular, to a bridging piece, a shielding cover and a display device.

DESCRIPTION OF THE RELATED ART

With the development of electronic technology, more and more attention is paid to the shielding technology of electronic products. Currently, a metal cover is added to a circuit board of electronic products to achieve a shielding effect. With the continuous development of technology, requirements on shielding and cooling of the circuit board are also getting stricter. Especially in the field of OLED display, the conventional shielding technology is relatively rough, and cannot meet requirements on shielding in the field of the OLED display more precisely.

SUMMARY OF THE INVENTION

The present disclosure has been made to overcome or alleviate at least one aspect of the above mentioned disadvantages.

According to an aspect of the present disclosure, there is provided a bridging piece comprising: a connector; and an insulative insert. The connector comprises a first surface and a second surface which are opposite to each other, and a conductive area electrically connecting the first surface with the second surface, the insulative insert being on the second surface of the connector.

Optionally, the first surface, the second surface, and at least two opposite side surfaces between the first surface and the second surface of the connector are cladded with a conductive sheet.

Optionally, the connector is made of conductive rubber which contains conductive particles.

Optionally, a through hole is provided on other two opposite side surfaces between the first surface and the second surface of the connector.

Optionally, the second surface of the connector is provided with a groove and one end of the insulative insert is provided with a first protrusion matched with the groove, and wherein the first protrusion is fitted into the groove such that the insulative insert is connected to the connector.

Optionally, the insulative insert is provided with a limit protrusion near the second surface of the connector, and a distance between the limit protrusion and the second surface is a first set value.

Optionally, the insulative insert comprises two limit protrusions and a slot is provided between the two limit protrusions.

Optionally, the insulative insert comprises two legs, each of which is provided with a limit protrusion, and the distance between any one of the limit protrusions and the second surface is a first set value.

Optionally, a slot is provided between the two legs, and the limit protrusion is located on a side of a corresponding one of the two legs facing away from the slot.

Optionally, the distance between the limit protrusion and the free end of the leg is a second set value.

Optionally, a second protrusion is provided on the second surface of the connector, a groove matched with the second protrusion is provided at one end of the insulative insert, and the second protrusion is fitted into the groove such that the insulative insert is connected to the connector.

According to another aspect of the present disclosure, there is provided a shielding structure for a display device with a circuit board. The shielding structure comprise: a shielding cover, and the bridging piece described above; and the bridging structure is inserted in an insertion hole of the circuit board such that the connector and the insulative insert are respectively located on either side of the circuit board, with the first surface of the connector being in electrical contact with the shielding cover, and the second surface being in electrical contact with the circuit board.

Optionally, the insulative insert comprises a limit protrusion thereon, and the circuit board is interposed between the second surface and the limit protrusion, and wherein a distance between the limit protrusion and the second surface is matched with the thickness of the circuit board.

Optionally, a groove is provided on the shielding cover, and a bottom surface of the groove is in electrical contact with the first surface of the connector.

Optionally, a through hole is provided on two opposite side surfaces of the groove.

According to another aspect of the present disclosure, there is provided a display device, comprising the shielding structure described above.

DETAILED DESCRIPTION OF PREFERRED EMBODIMENTS

To make the foregoing objectives, characteristics and advantages of the present disclosure more comprehensible and comprehensible, the disclosure is described in further detail below with reference to the accompanying drawings and specific embodiments.

Figure 1:
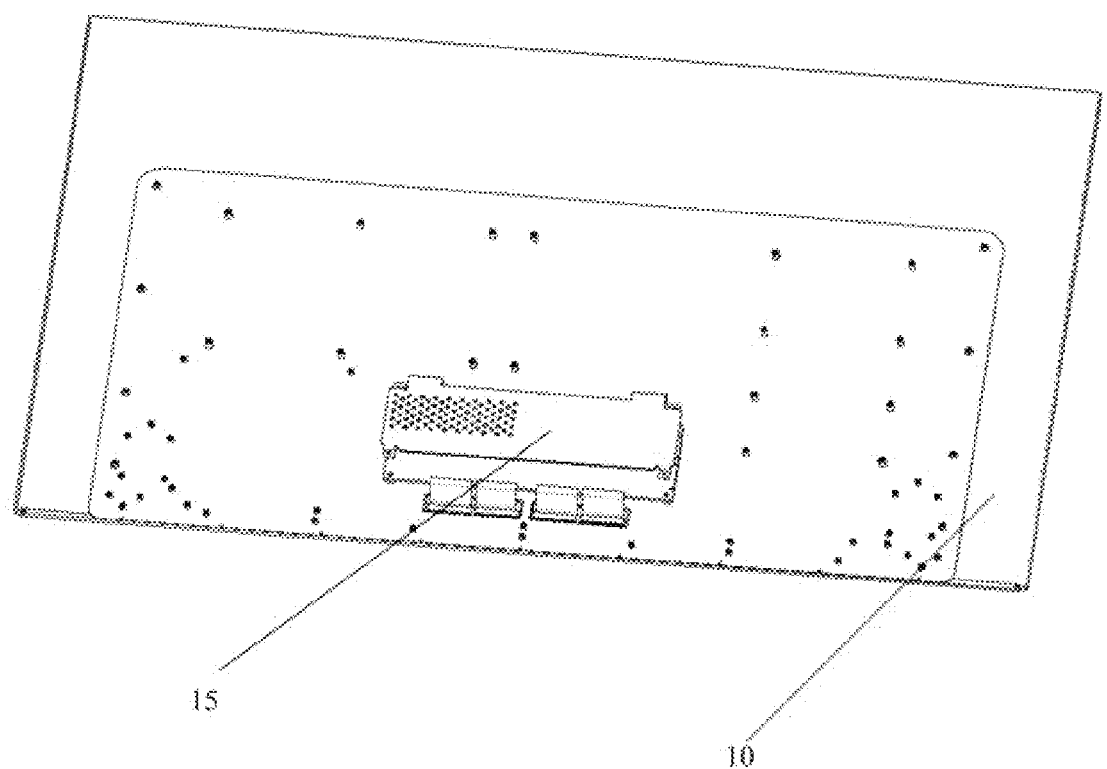
FIG. 1 is a schematic view of a conventional shielding structure of a circuit board.

Referring to FIG. 1, there is shown an example of shielding using a conventional metal cover 15. This example will be described by taking a television as an example. FIG. 1 is a rear view of a television set including a box-shaped metal shielding cover 15, which is fixed by screws around a circuit board 10.

According to an aspect of the present general inventive concept, there is provided a bridging piece, a shielding structure and a display device. The bridging piece includes a connector and an insulative insert. The connector comprises a first surface and a second surface which are opposite to each other, and a conductive area electrically connecting the first surface with the second surface, the insulative insert is connected onto the second surface of the connector.

Figure 2:
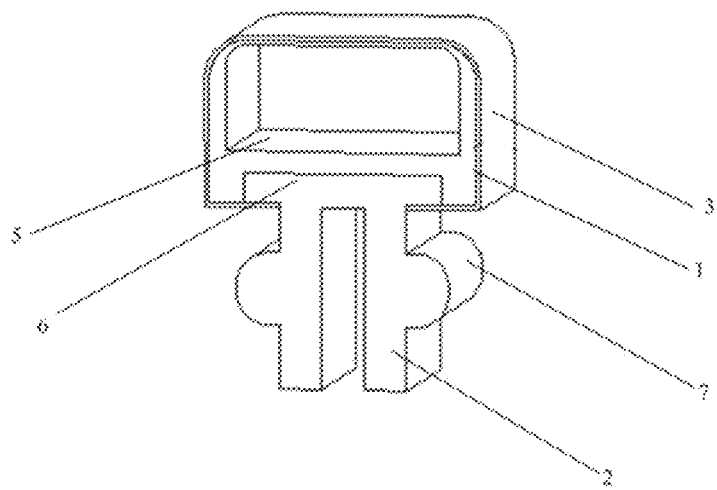
FIG. 2 is a schematic structural view of the bridging piece of the present disclosure.

Referring to FIG. 2, in which a schematic structural view of a bridging piece according to the present disclosure is shown. The bridging piece specifically includes a connector 1 and an insulative insert 2.

The connector 1 includes a first surface (an upper surface) and a second surface (a lower surface) which are opposite to each other. The connector 1 further includes a conductive area electrically connecting the first surface with the second surface. The insulative insert 2 is connected onto the second surface of the connector 1.

In practical applications, the first surface, the second surface, and at least two opposite side surfaces between the first surface and the second surface of the connector 1 are cladded with a conductive sheet 3.

The conductive sheet is made of a conductive metal material, such as aluminum, copper, iron.

The connector is made of conductive rubber which contains conductive particles.

The conductive particles may be any one of conductive particles such as silver plated glass, silver plated aluminum and silver, or a combination of the above. The present disclosure is not particularly limited thereto. The conductive particles are uniformly distributed in the conductive rubber so as to achieve a good conductive property.

The insulative insert 2 may be made of a plastic material or an elastic material.

A through hole 5 is provided on the other two opposite side surfaces between the first surface and the second surface of the connector 1.

The second surface of the connector 1 is provided with a groove and one end of the insulative insert 2 is provided with a first protrusion 6 matched with the groove. The first protrusion 6 is fitted into the groove such that the insulative insert 2 is connected to the connector 2.

The insulative insert 2 is provided with a limit protrusion 7 near the second surface of the connector 1, and the distance between the limit protrusion 7 and the second surface meets/satisfies a preset threshold value.

As the insulative insert 2 is provided with a limit protrusion 7, and the limit protrusion 7 is disposed at a distance from the second surface of the connector; and there is also a certain distance between the limit protrusion 7 and a back shell 12 of an electronic product, thereby avoiding any electrical interference between parts.

It should be noted that the distance between the limit protrusion and the second surface of the connector and the distance between the limit protrusion and the back shell 12 of the electronic product meet/satisfy preset thresholds, respectively, which may be set by those skilled in the art using any proper manners. For example, the thresholds may be set artificially according to experience, or the thresholds may be set according to the difference in historical data, or may be set in other manners, which is not limited in the present disclosure.

Optionally, two limit protrusions 7 are provided, and a slot is provided between the two limit protrusions 7 on the insulative insert 2. As such, provided that the insulative insert is mounted on the circuit board, since the insulative insert is made of plastic material or elastic material, then the limit protrusion can be inserted into the circuit board due to the existence of the slot, thereby achieving a function of fixing and limiting and also increasing supporting strength of the circuit board. Especially in some stability tests, such an arrangement may ensure the stability of the circuit board structure.

The bridging piece in this embodiment includes a connector and an insulative insert. The connector includes a first surface and a second surface which are opposite to each other, and a conductive area electrically connecting the first surface with the second surface. The insulative insert is connected onto the second surface of the connector. The shielding cover is electrically connected to circuit board therebeneath through the connector, thereby achieving a shielding.

Figure 3:
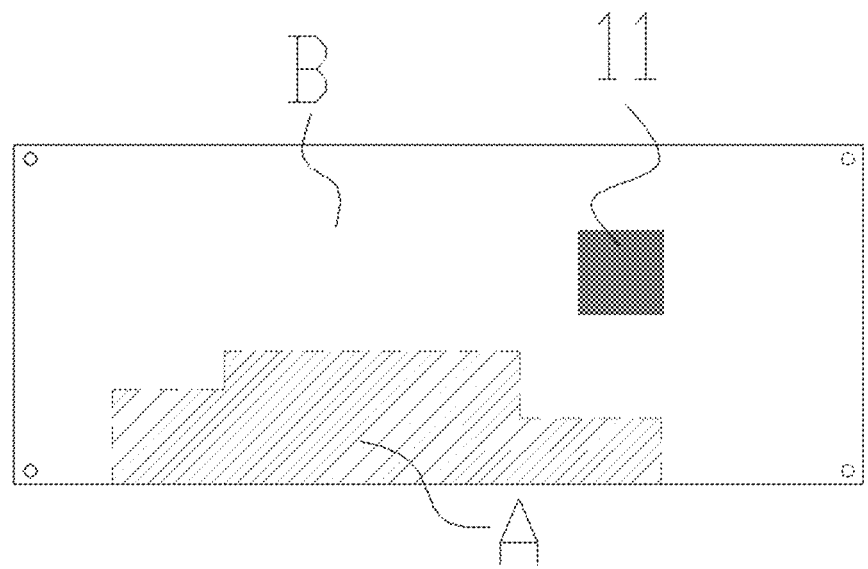
FIG. 3 is a schematic structural view of the circuit board of the present disclosure.

Referring to FIG. 3, in which a schematic structural view of a circuit board of the present disclosure is shown, the circuit board mainly includes a main chip 11, other electronic element regions B distributed accompanied with a layout of the main chip 11, and an unshielded region A.

The main chip 11 in the circuit board generally has relatively higher processing capability and occupies a relatively larger size. Therefore, the main chip is generally a main shielded structure. The electronic element regions B is provided with electronic elements accompanied with the layout of the main chip, which also needs to be subject to a certain shielding. However, the shielding effect needed by the electronic element regions B is weaker compared with that of the main chip. The unshielded region A may be the region(s) where shielding is not needed, such as an interface.

As electronic products have the more and more functions, processing capacity of which also becomes stronger and stronger, the processing capacity of the main chip is also increased, requirements on the shielding process to the entire circuit board are in turn increased, especially for the main chip. It is proposed in the embodiment of the present disclosure to add a bridging piece in the shielding structure and to combine the bridging piece with the circuit board so as to achieve an enhanced shielding to the main chip and improve the stability of the circuit board.

Figure 4:
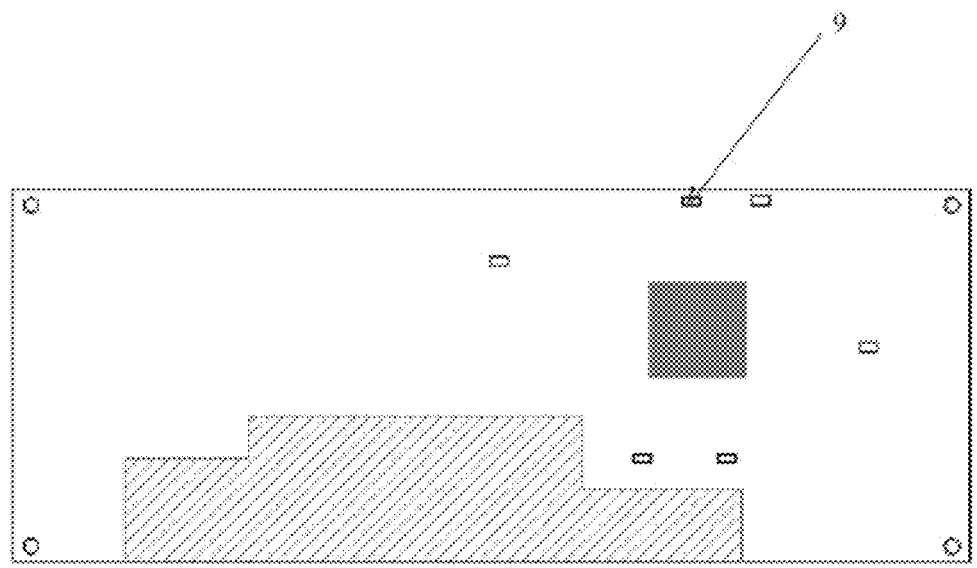
FIG. 4 is a schematic structural view of a distribution of the bridging piece in the circuit board of the present disclosure.

Further, in order to achieve a better and more stable shielding effect, a multi-point coordination enhancement is required, that is, in the shielding structure, respective bridging pieces are distributed uniformly in proximity of the main chip on the circuit board. As shown in FIG. 4, six bridging pieces 9 are provided around the main chip to achieve an enhanced shielding to the main chip.

Figure 5:
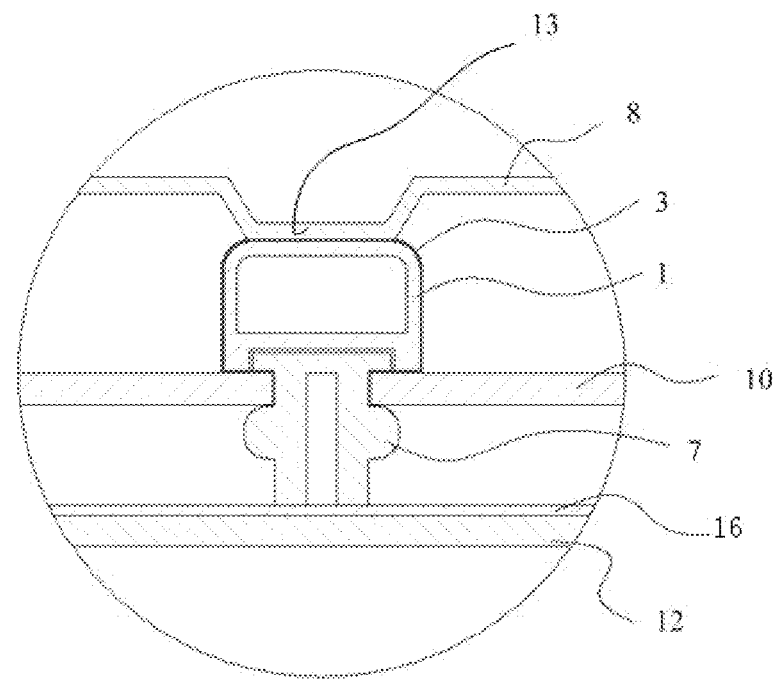
FIG. 5 is a cross-sectional view of a shielding structure of the present disclosure in a mounted state.

Referring to FIG. 5, in which a cross-sectional view of a shielding structure of the present disclosure in a mounted state is shown. The shielding structure is applied to a display device including a circuit board. Specifically, the shielding structure includes a shielding cover 8, a bridging piece 9, a circuit board 10, an insulative sheet 16 and a back shell 12 of the electronic product.

The circuit board 10 is mounted on the insulative sheet of the back shell 12, and the shielding cover 8 is connected to the circuit board through the bridging piece 9. The circuit board 10 and the shielding cover 8 are connected together by the bridging piece 9 to form an integral shielding structure, effectively collaborating to perform shielding.

The bridging piece 9 includes a connector 1 and an insulative insert 2.

The insulative insert 2 is inserted into an insertion hole of the circuit board 10. The connector 1 and the insulative insert 2 are located on either side of the circuit board 10, respectively. The first surface of the connector 1 is in electrical contact with the shielding cover 8, and the second surface of the connector 1 is in electrical contact with the circuit board 10.

The first surface, the second surface and at least two opposite side surfaces between the first surface and the second surface of the connector 1 are cladded with a conductive sheet 3. The connector is made of conductive rubber. Since the conductive rubber contains conductive particles, provided that the bridging piece is pressed against the shielding piece, both elastic force and supporting effect of the connector may be improved, so that the conductive particles may be in better contact with one another, thereby improving the electrical conductivity between the shielding cover and the circuit board.

The insulative insert 2 has a limit protrusion 7 therein. The bridging piece 9 may be inserted into the insertion hole of the circuit board 10 so as to serve as a fixing limit and also improve the supporting strength of the circuit board. Especially in some stability tests, structural stability of the circuit board may be insured.

Optionally, when the insulative insert has a limit protrusion thereon, the circuit board is located between the second surface of the connector and the limit protrusion of the insulative insert, and the distance between the limit protrusion of the insulative insert and the second surface of the connector is set to match the thickness of the circuit board.

By providing the bridging piece, there is a set distance between the circuit board and the shielding cover and there is also a set distance between the circuit board and the insulative sheet on the back shell of the electronic product, so as to avoid the mutual electrical interference between the circuits.

In practical applications, some insertion holes may be provided at the position of the circuit board which is needed to be shielded, or at a ground position, or a filter position, and the bridging piece may be inserted in the corresponding insertion holes of the circuit board.

Figure 6:
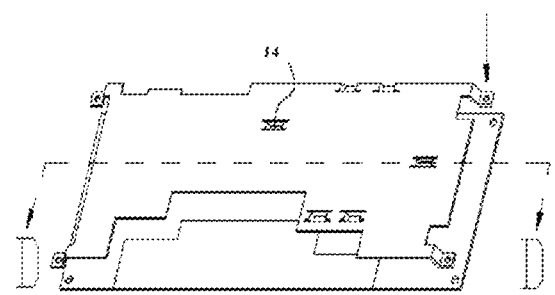
FIG. 6 is a schematic structural view of a shielding structure of the present disclosure in the mounted state, in which the shielding cover is provided with a through hole.

The shielding structure further includes a groove 13 disposed on the shielding cover, a bottom surface of which groove is in electrical contact with the first surface of the connector. A through hole is disposed between two opposite side surfaces of the groove 13, and another through hole is also provided between other two opposite side surfaces between the first surface and the second surface of the connector. A bottom-up convection is created which passes through both the through hole in the connector and the through hole in the groove 13, such that the heat generated on the circuit board is dissipated out, thereby further improving the stability of the circuit board, as shown in FIG. 6, in which a schematic structural view of a shielding structure of the present disclosure in the mounted state is shown, and the shielding cover is provided with a through hole. Once the bridging piece is mounted, the shielding cover is fixed to metal holes at four corners of the circuit board. Specifically, in this embodiment, the bridging piece is laterally and horizontally inserted so that a bottom-up convection may be created which passes through both the through-hole in the conductive rubber in the bridging piece and the through-hole 14 in the groove 13 of the shielding cover. The cross-section view of the embodiment of the present disclosure shown in FIG. 5 may be obtained in a direction along the line D-D as illustrated in FIG. 6.

The shielding structure of this embodiment includes a bridging piece and a shielding cover, and the metal cover and the circuit board are connected together through a bridging piece to form an integral shielding structure, so as to achieve the shielding process to the circuit board.

The present disclosure also relates to a display device including the above shielding structure.

It should be noted that the display device in this embodiment may be applied to any products or components having a display function, such as a mobile phone, a tablet, a television, a notebook computer, a digital photo frame, a navigator.

The display device has all the advantages of the shielding structure, which will not be repeated here.

Each embodiment in this specification is described in a progressive manner. The description of each embodiment focuses on differences from other embodiments, and the same or similar parts in various embodiments may refer to each other.

It is easily understood by those skilled in the art that any combination of the above embodiments are conceivable, and thus any combinations of the above embodiments belong to the embodiments of the present disclosure. However, due to space limitations, they will not be described in the present disclosure in detail one by one.

It should be noted that, in this disclosure, the terms "include", "comprise" include not only those elements, but also other elements which are not explicitly listed, or further include those elements inherent to such process, method, items, or device. Without further limitations, elements defined by the statement "include . . . " do not exclude other similar elements that presented in the process, method, items, or device that includes the element.

Moreover, the "and/or" in the above contents indicates that the present document includes both the "and" and the relationship of "or", in which: if the relationship between the solution A and the solution B is "and", it indicates that an embodiment may include both solutions A and B; if the relationship between the solution A and the solution B is "or", it indicates that an embodiment may include solution A alone, or solution B alone.

Although embodiments of the present disclosure have been described, those skilled in the prior art, given their basic inventive concepts, may make additional variations and modifications to these embodiments. Therefore, the appended claims are intended to be interpreted as including the embodiments and all the modifications and alterations falling within the scope of the present disclosure.

The bridging piece, the shielding structure and the display device provided in the present disclosure are described in detail above. Specific examples are used herein to describe the principle and implementation manners of the present disclosure. The description of the foregoing embodiments is merely intended to help understanding the method of the present disclosure and the core idea thereof. Meanwhile, those skilled in the art may make modifications to the specific implementation manners and the application scope according to the ideas of the present disclosure. As a summary, the content of the present disclosure should not be understood as a limitation of the present disclosure.

What is claimed is:

1. A bridging piece comprising:
   a connector; and
   an insulative insert,
   wherein the connector comprises a first surface and a second surface which are opposite to each other, and a conductive area electrically connecting the first surface with the second surface, the insulative insert being on the second surface of the connector,
   wherein the first surface, the second surface, and at least two opposite side surfaces between the first surface and the second surface of the connector are cladded with a conductive sheet, and wherein the connector is made of conductive rubber which contains conductive particles.

2. The bridging piece according to claim 1,
wherein a through hole is provided on two other opposite side surfaces between the first surface and the second surface of the connector.

3. The bridging piece according to claim 1,
wherein the second surface of the connector is provided with a groove and one end of the insulative insert is provided with a first protrusion matched with the groove, and wherein the first protrusion is fitted into the groove such that the insulative insert is connected to the connector.

4. The bridging piece according to claim 1,
wherein a second protrusion is provided on the second surface of the connector, a groove matched with the second protrusion is provided at one end of the insulative insert, and the second protrusion is fitted into the groove such that the insulative insert is connected to the connector.

5. The bridging piece according to claim 1,
wherein the insulative insert is provided with a limit protrusion near the second surface of the connector, and a distance between the limit protrusion and the second surface is a first set value.

6. The bridging piece according to claim 5,
wherein the insulative insert comprises two limit protrusions, and a slot is provided between the two limit protrusions.

7. The bridging piece according to claim 5,
wherein the insulative insert comprises two legs, each of which is provided with a limit protrusion, and the distance between any one of the limit protrusions and the second surface is a first set value.

8. The bridging piece according to claim 7,
wherein a slot is provided between the two legs, and each limit protrusion is located on a side of a corresponding one of the two legs facing away from the slot.

9. The bridging piece according to claim 7,
wherein a distance between each limit protrusion and a free end of a corresponding leg is a second set value.

10. A shielding structure for a display device with a circuit board, wherein the shielding structure comprises:
a shielding cover, and
the bridging piece according to claim 1;
wherein the bridging piece is inserted in an insertion hole of the circuit board such that the connector and the insulative insert are respectively located on either side of the circuit board, with the first surface of the connector being in electrical contact with the shielding cover, and the second surface being in electrical contact with the circuit board.

11. The shielding structure according to claim 10, wherein the insulative insert comprises a limit protrusion thereon, and the circuit board is interposed between the second surface and the limit protrusion, and wherein a distance between the limit protrusion and the second surface is matched with a thickness of the circuit board.

12. A display device, comprising the shielding structure according to claim 10.

13. The shielding structure according to claim 10, wherein a groove is provided on the shielding cover, and a bottom surface of the groove is in electrical contact with the first surface of the connector.

14. The shielding structure according to claim 13, wherein a through hole is provided on two opposite side surfaces of the groove.

* * * * *